(12) United States Patent
Kuwahara et al.

(10) Patent No.: US 7,771,211 B2
(45) Date of Patent: Aug. 10, 2010

(54) SOCKET WITH BASE SHELL, COVER SHELL AND CONTACT MEMBER FOR MOUNTING ELEMENT WITHIN CAVITY DEFINED BY BASE SHELL AND COVER SHELL

(75) Inventors: Akira Kuwahara, Tokyo (JP); Takuya Takahashi, Tokyo (JP); Hiroshi Akimoto, Tokyo (JP); Seiya Takahashi, Tokyo (JP); Yoshiaki Ishiyama, Tokyo (JP); Hiroshi Endo, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 12/231,645

(22) Filed: Sep. 4, 2008

(65) Prior Publication Data
US 2009/0075510 A1 Mar. 19, 2009

(30) Foreign Application Priority Data
Sep. 14, 2007 (JP) .............................. 2007-239803

(51) Int. Cl.
*H01R 12/00* (2006.01)
*H05K 1/00* (2006.01)
(52) U.S. Cl. ....................................................... 439/70
(58) Field of Classification Search .................. 439/70, 439/71, 66, 67
See application file for complete search history.

(56) References Cited

U.S. PATENT DOCUMENTS 3,998,512 A * 12/1976 Anhalt et al. ................. 439/66
5,273,440 A * 12/1993 Ashman et al. ............... 439/71
7,303,403 B2 12/2007 Kuwahara ..................... 439/66
2003/0236007 A1* 12/2003 Lye et al. ...................... 439/71
2005/0233629 A1 10/2005 Tsai ........................... 439/331
2006/0244111 A1 11/2006 Kuwahara .................... 257/668

FOREIGN PATENT DOCUMENTS

| EP | 0 279 751 | 8/1988 |
| EP | 1 355 384 | 10/2003 |
| JP | 7-335353 | 12/1995 |
| JP | 8-203583 | 8/1996 |
| JP | 2001-015186 | 1/2001 |
| JP | 2004-006199 | 1/2004 |
| JP | 2004-227919 | 8/2004 |
| JP | 2006-310140 | 11/2006 |
| JP | 2006-331801 | 12/2006 |
| WO | WO 2006/117462 | 11/2006 |

OTHER PUBLICATIONS

Japanese Office Action dated Jul. 9, 2009 with English translation of same.
Extended European Search Report dated Feb. 10, 2010.

* cited by examiner

*Primary Examiner*—Javaid Nasri
(74) *Attorney, Agent, or Firm*—Collard & Roe, P.C.

(57) ABSTRACT

The present invention provides a socket for an element with an element electrode. The socket comprises a base shell, a cover shell and a contact member. The cover shell is engaged with the base shell so that the base shell and the cover shell define a cavity. Each of the base shell and the cover shell is made of a high thermal-conductive material. The contact member comprises an elastic member and a contact electrode provided on the elastic member and are designed and arranged so that the element is mountable on the contact member within the cavity with the element electrode connected to the contact electrode.

6 Claims, 4 Drawing Sheets

SOCKET WITH BASE SHELL, COVER SHELL AND CONTACT MEMBER FOR MOUNTING ELEMENT WITHIN CAVITY DEFINED BY BASE SHELL AND COVER SHELL

CROSS REFERENCE TO RELATED APPLICATIONS

Applicants claim priority under 35 U.S.C. §119 of Japanese Application No. 2007-239803 filed on Sept. 14, 2007.

BACKGROUND OF THE INVENTION

This invention relates to a socket for an element such as an LED (Light Emitting Diode) element. LED elements are generally robust and have high luminous efficiencies. However, they generate a large amount of heat that causes a problem. Therefore, heat dissipation should be considered.

Heat dissipation technologies are disclosed in, for example, JP-A 2001-15186 and JP-A 2006-331801, each of which is incorporated herein by reference in its entirety.

According to JP-A 2001-15186, a socket is provided with a heat sink. However, the heat sink hinders miniaturization of the socket.

According to JP-A 2006-331801, a socket is provided with a heat dissipation member. However, no consideration is made about a technique for connecting an LED element to the socket.

SUMMARY OF THE INVENTION

It is an object of the present invention to provide a socket that has an improved heat dissipation property.

In accordance with one aspect of the present invention, there is provided a socket for an element with an element electrode. The socket comprises a base shell, a cover shell engaged with the base shell so that the base shell and the cover shell define a cavity, and a contact member comprising an elastic member and a contact electrode provided on the elastic member. The contact member is designed and arranged so that the element is mountable on the contact member within the cavity with the element electrode connected to the contact electrode.

An appreciation of the objectives of the present invention and a more complete understanding of its structure may be had by studying the following description of the preferred embodiment and by referring to the accompanying drawings.

Figure 1:
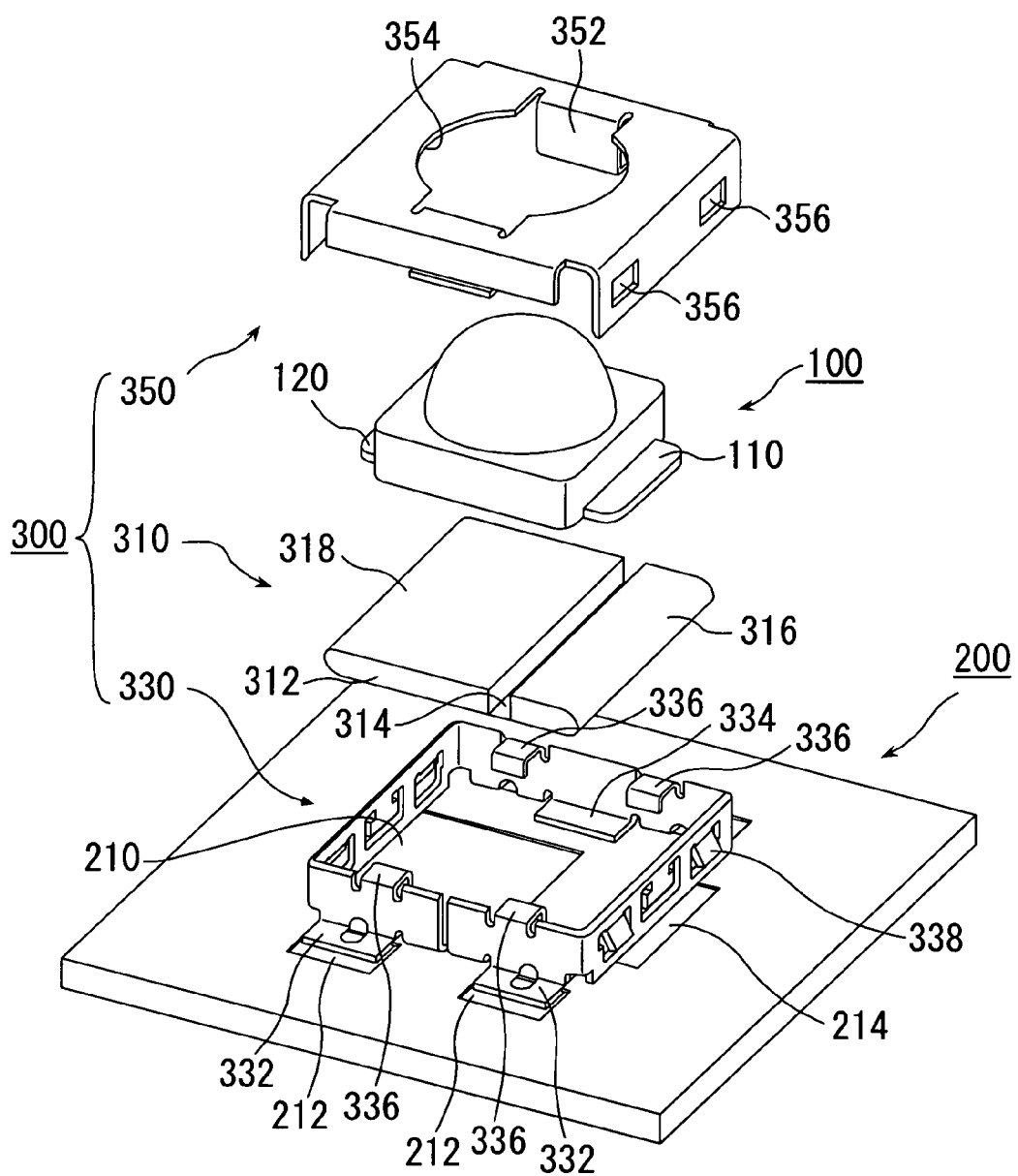
FIG. 1 is an exploded perspective view of a socket according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENT

Figure 2:
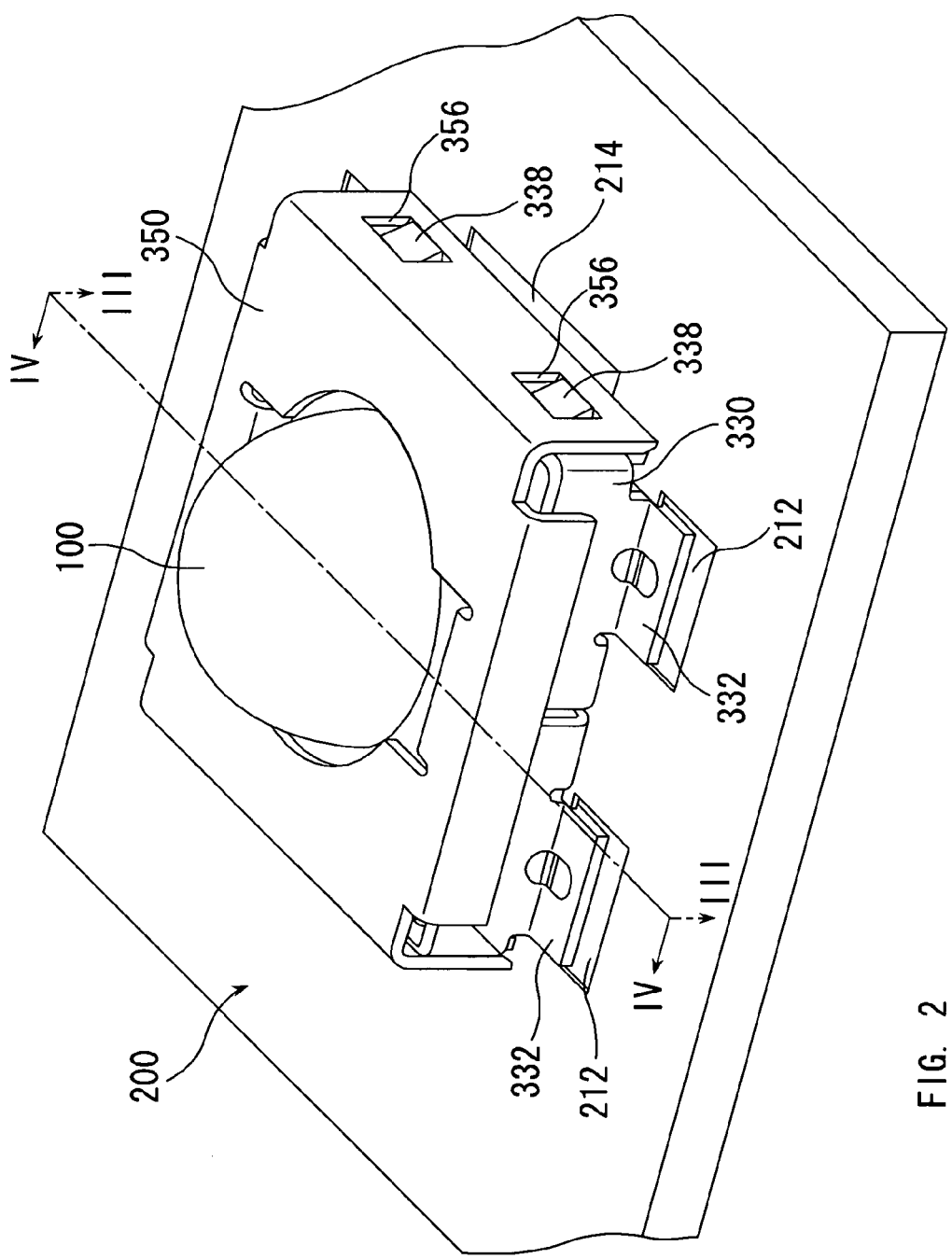
FIG. 2 is a perspective view of the socket of FIG. 1.
Figure 3:
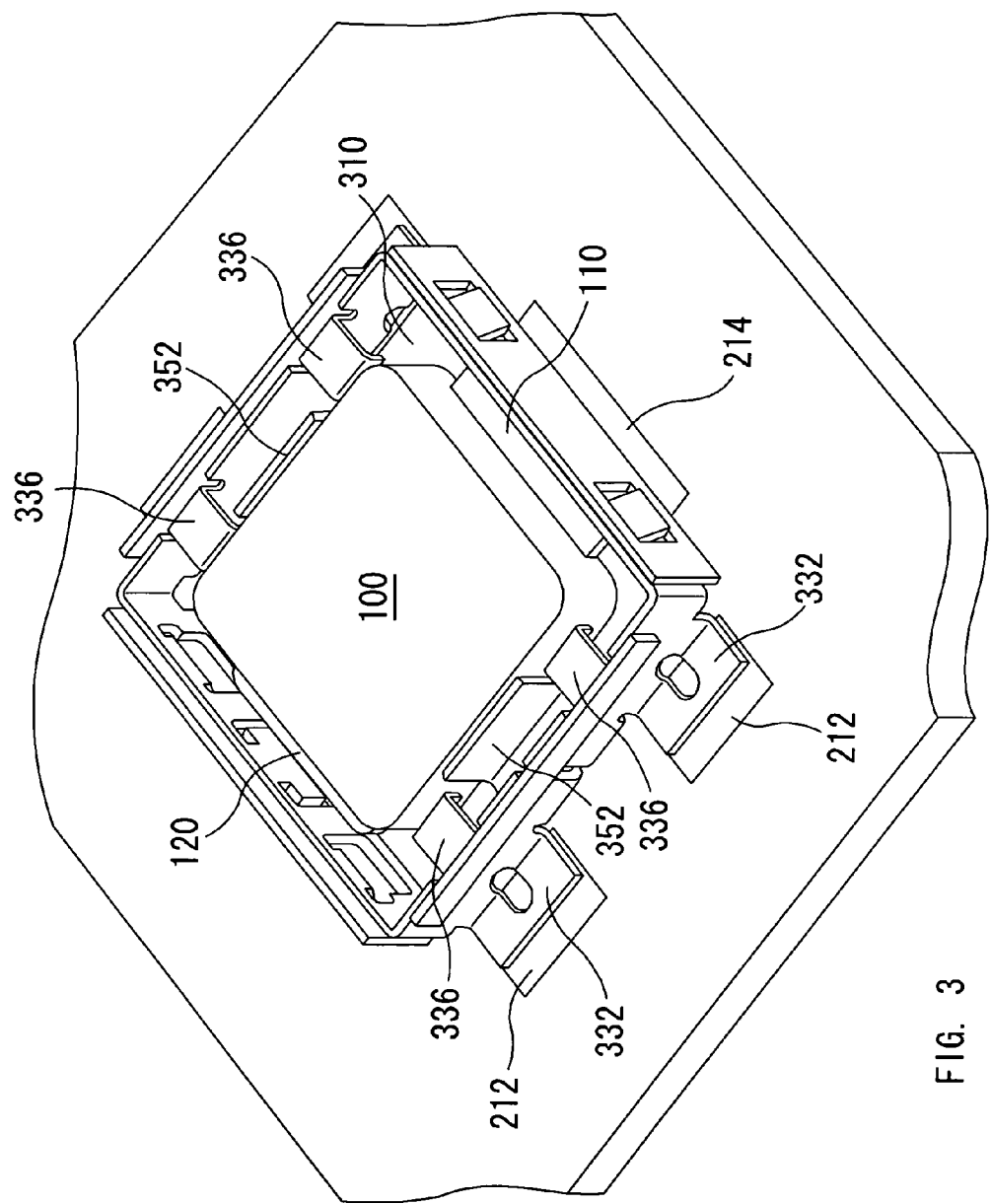
FIG. 3 is a cross sectional view of the socket, taken along lines III-III of FIG. 2.

With reference to FIGS. 1 to 3, a socket 300 according to an embodiment of the present invention is used for connecting an LED (Light Emitting Diode) element 100 and a substrate 200. The LED element 100 comprises an anode 110 and a cathode 120. The substrate 200 is provided with two pads 210 and 214 and four ground pads 212.

The socket 300 comprises a contact member 310, a base shell 330 and a cover shell 350. The cover shell 350 is engaged with the base shell 330 so that the base shell 330 and the cover shell 350 define a cavity that can accommodate the contact member 310 and the LED element 100 at least in part.

The base shell 330 has a frame which is made of a high thermal-conductive material. The base shell 330 is provided with four hold down portions 332, heat-transfer fins 334, four position-fins 336 and four engage-tongues 338. Each hold down portion 332 extends outward from a bottom edge of the frame. The base shell 330 is fixed to the substrate 200 by soldering the hold down portions 332 to the ground pads 212. Each heat-transfer fin 334 extends inward from the bottom edge of the frame. Each position-fin 336 extends inward from a top edge of the frame. Each position-fin 336 has an inverted L-shape which has an end extending downwards. Each engage-tongue 338 projects outward from the frame by making an U-shaped cut on the frame followed by bending the cut portion outward.

The contact member 310 of this embodiment comprises two plate-like elastic blocks 312, an insulation film 314 and two electrodes 316 and 318. Each elastic block 312 has an upper top surface and a lower surface. The insulation film 314 is attached to the elastic blocks 312. The electrodes 316 and 318 are made of conductive films which are formed on the insulation film 314 and correspond to the elastic blocks 312, respectively. The electrode 316 covers the upper surface and the lower surface of one of the elastic blocks 312 with the insulation film 314 interposed between the electrode 316 and the elastic block 312. The electrode 318 covers the upper surface and the lower surface of the other elastic block 312 with insulation film 314 interposed between the electrode 318 and the other elastic block 312. The contact member 310 is arranged in the frame of the base shell 330; the electrode 316 is electrically connected to the pad 214; the electrode 318 is electrically connected to the pad 210 and is brought into contact with the heat-transfer fin 334. As understood from FIGS. 1 and 2, the contact member 310 of the present embodiment allows various different arrangements of the pads 210 and 214 because the electrodes 318 and 316 have large areas.

The cover shell 350 of this embodiment is made of a high thermal-conductive material similarly to the base shell 330. The cover shell 350 has two binding-fins 352, an opening 354 and four windows 356. The binding-fins 352 are formed to correspond to the heat-transfer fins 334, respectively. The opening 354 allows a part of the LED element 100 to project from the cover shell 350 when the LED element 100 is partially accommodated in the cavity. The four windows 356 correspond to the engage-tongues 338, respectively and the engage-tongues 338 are engaged with the four windows 356 so that the base shell 330 and the cover shell 350 are combined and define the aforementioned cavity.

Figure 4:
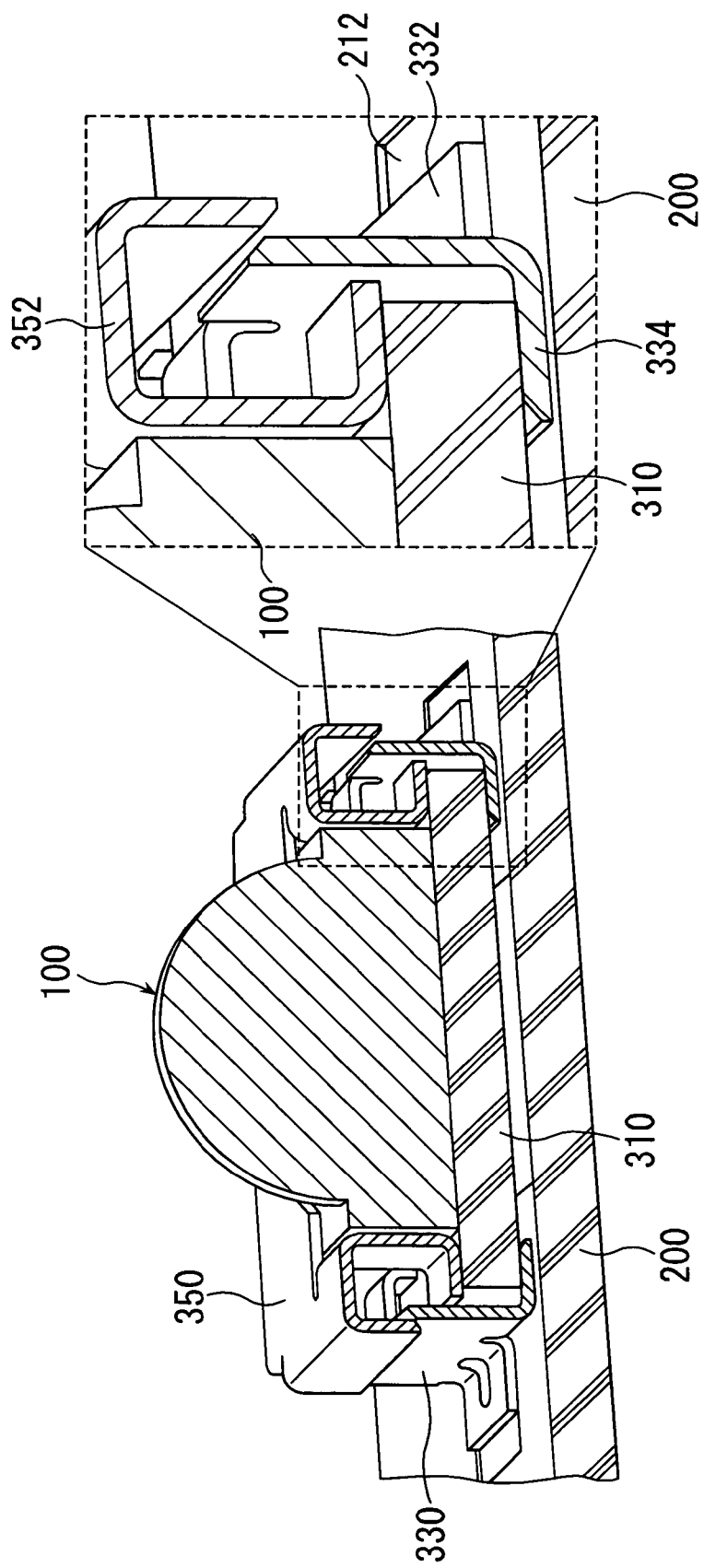
FIG. 4 is a cross sectional view of the socket, taken along lines IV-IV of FIG. 3.

Upon practical use of the socket 300, the LED element 100 is mounted on the contact member 310 so that the anode 110 and the cathode 120 are electrically connected to the pads 214 and 210 through the electrodes 316 and 318, respectively. The cover shell 350 is engaged with the base shell 330. The contact member 310 and the LED element 100 are accommodated within the cavity, while a part of the LED element 100 projects from the cover shell 350, as shown in FIG. 2. With reference to FIGS. 3 and 4, the contact member 310 is held between the binding-fins 352 and the heat-transfer fins 334. The binding fins 352 serve to adjust position of the LED element 100 in the cavity.

The LED element 100 is thermally coupled to the contact member 310. The contact member is thermally coupled to the base shell 330 and the cover shell 350 through the heat-transfer fins 334 and the binding-fins 352, respectively. Therefore, even if the LED element 100 generates heat, the heat is transferred through the contact member 310 to the base shell 330 and the cover shell 350 so that they dissipate the heat. In other words, each of the base shell 330 and the cover shell 350 serves as a heat sink. In addition, the contact member 310 has a large area on which the LED element 100 is mounted. The large area of the contact member 310 can also dissipate the heat of the LED element 100. Thus, the socket 300 of this embodiment has a high improved heat-dissipation property.

Although the contact member 310 of the embodiment comprises the elastic blocks 312, the contact member 310 may comprise packed gel-like elastic members instead thereof. Each of the elastic blocks 312 may be made of a material having a heat-dissipation property, such as a silicone rubber. The heat-dissipation material of the elastic blocks 312 further improve the heat-dissipation property of the socket 300.

The present application is based on a Japanese patent application of JP2007-239803 filed before the Japan Patent Office on Sep. 14, 2007, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

The invention claimed is:

1. A socket for an element with an element electrode, the socket comprising:
   a base shell;
   a cover shell engaged with the base shell so that the base shell and the cover shell define a cavity; and
   a contact member comprising an elastic member and a contact electrode provided on the elastic member, the contact member being designed and arranged so that the element is mountable on the contact member within the cavity with the element electrode connected to the contact electrode, wherein:
   the elastic member has a plate-like shape, the plate-like shape having an upper surface and a lower surface;
   the contact member further comprises an insulator film covering the upper surface and the lower surface; and
   the insulator film is formed with a conductive film which serves as the contact electrode, the conductive film covering the upper surface and the lower surface with the insulation film interposed between the conductive film and the elastic member.

2. The socket according to claim 1, wherein:
   each of the base shell and the cover shell is made of a high thermal-conductive material;
   the base shell is formed with a first fin;
   the cover shell is formed with a second fin; and
   the contact member is held directly between the first and the second fins so that the contact member is thermally coupled to the base shell and the cover shell.

3. The socket according to claim 2, wherein the element is an LED (Light Emitting Diode) element.

4. The socket according to claim 2, wherein the second fin serves to locate the element within the socket.

5. The socket according to claim 4, wherein the element is an LED (Light Emitting Diode) element.

6. The socket according to claim 1, wherein the element is an LED (Light Emitting Diode) element.

* * * * *